United States Patent
Kishimoto et al.

(10) Patent No.: US 7,540,257 B2
(45) Date of Patent: Jun. 2, 2009

(54) PLASMA PROCESSING APPARATUS AND SEMICONDUCTOR DEVICE MANUFACTURED BY THE SAME APPARATUS

(75) Inventors: Katsushi Kishimoto, Kyoto (JP); Yusuke Fukuoka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 255 days.

(21) Appl. No.: 11/328,448

(22) Filed: Jan. 10, 2006

(65) Prior Publication Data
US 2006/0151319 A1    Jul. 13, 2006

(30) Foreign Application Priority Data
Jan. 13, 2005    (JP)    ............... 2005-006605

(51) Int. Cl.
C23C 16/00    (2006.01)
(52) U.S. Cl. .................................. 118/723 E
(58) Field of Classification Search ............. 118/723 E; 156/345.43, 345.44, 345.45, 345.46, 345.47; 315/111.21
See application file for complete search history.

(56) References Cited

U.S. PATENT DOCUMENTS

| | | | |
|---|---|---|---|
| 4,264,393 A | | 4/1981 | Gorin et al. |
| 4,287,851 A | | 9/1981 | Dozier |
| 4,292,153 A | * | 9/1981 | Kudo et al. ................. 204/164 |
| 4,381,965 A | * | 5/1983 | Maher et al. ........... 156/345.45 |
| 4,633,811 A | * | 1/1987 | Maruyama ............... 118/723 E |
| 4,664,890 A | | 5/1987 | Tawada et al. |
| 4,676,865 A | * | 6/1987 | DeLarge ....................... 216/71 |
| 4,825,806 A | * | 5/1989 | Tawada et al. .............. 118/719 |
| 4,887,005 A | | 12/1989 | Rough et al. |
| 5,041,201 A | * | 8/1991 | Yamazaki et al. ...... 204/192.32 |
| 5,061,359 A | * | 10/1991 | Babu et al. .............. 204/298.07 |
| 5,082,547 A | * | 1/1992 | DeLarge ................. 204/298.39 |
| 5,515,986 A | * | 5/1996 | Turlot et al. ................... 216/71 |
| 5,653,810 A | * | 8/1997 | Kataoka et al. .......... 118/723 E |

(Continued)

FOREIGN PATENT DOCUMENTS

EP    0 689 226 A1    12/1995

(Continued)

OTHER PUBLICATIONS

European Search Report mailed Jun. 1, 2006 in corresponding EP Application No. 06000502.2

(Continued)

*Primary Examiner*—Parviz Hassanzadeh
*Assistant Examiner*—Michelle Crowell
(74) *Attorney, Agent, or Firm*—Nixon & Vanderhye, P.C.

(57) ABSTRACT

A plasma processing apparatus of this invention includes a sealable chamber to be introduced with reactive material gas, a plurality of pairs of cathode-anode bodies arranged in the chamber, for forming a plurality of discharge spaces for performing plasma discharge of the material gas, a power supply for plasma discharge, placed outside the chamber, a matching box placed outside the chamber, for matching impedance between the cathode-anode bodies and the power supply, and a power introduction wire extending to each of the cathodes from the power supply via the matching box. Herein, the power introduction wire is branched to the number corresponding to the number of the cathodes between the matching box and the cathodes, and the branched wires are symmetrically extended.

19 Claims, 4 Drawing Sheets

U.S. PATENT DOCUMENTS

| | | | |
|---|---|---|---|
| 5,753,886 A | 5/1998 | Iwamura et al. | |
| 5,795,452 A | 8/1998 | Konoshita et al. | |
| 5,834,730 A | 11/1998 | Suzuki et al. | |
| 5,958,141 A | 9/1999 | Kitabatake et al. | |
| 6,017,396 A | 1/2000 | Okamoto | |
| 6,189,485 B1 * | 2/2001 | Matsuda et al. | 118/723 E |
| 6,349,670 B1 * | 2/2002 | Nakano et al. | 118/723 E |
| 2003/0155332 A1 | 8/2003 | Datta et al. | |
| 2003/0164143 A1 | 9/2003 | Toyoda et al. | |
| 2004/0187785 A1 | 9/2004 | Kishimoto et al. | |
| 2006/0087211 A1 | 4/2006 | Kishimoto et al. | |
| 2006/0191480 A1 | 8/2006 | Kishimoto et al. | |

FOREIGN PATENT DOCUMENTS

| | | |
|---|---|---|
| JP | 54-106081 A | 8/1979 |
| JP | 60-624 U | 1/1985 |
| JP | 61-214513 A | 9/1986 |
| JP | 4-164895 | 6/1992 |
| JP | 9-209151 A | 8/1997 |
| JP | 2000-294511 A | 10/2000 |
| JP | 2001-85409 A | 3/2001 |
| JP | 2004-22638 A | 1/2004 |
| JP | 2004-259853 A | 9/2004 |
| WO | 2005/045873 A2 | 5/2005 |

OTHER PUBLICATIONS

U.S. Final Office Action mailed Aug. 4, 2008 in corresponding U.S. Appl. No. 11/252,885.

European Search Report mailed May 12, 2006 in EP application No. 06000503.0.

Patent Abstracts of Japan, vol. 009, No. 143 (E-322) Jun. 18, 1985 & JP 60 025235 A (Hitachi Seisakusho KK), Feb. 8, 1985.

U.S. Office Action mailed Oct. 5, 2007 in U.S. Appl. No. 10/787,748.

U.S. Office Action mailed Dec. 14, 2007 in U.S. Appl. No. 11/252,885.

* cited by examiner

US 7,540,257 B2

PLASMA PROCESSING APPARATUS AND SEMICONDUCTOR DEVICE MANUFACTURED BY THE SAME APPARATUS

CROSS-REFERENCE TO RELATED APPLICATION

This application is related to Japanese Patent Application No. 2005-006605 filed on Jan. 13, 2005, on the basis of which priority is claimed under 35 USC §119, the disclosure of this application being incorporated by reference in its entirety.

BACKGROUND OF THE INVENTION

1. Field of the Invention

The present invention relates to a plasma processing apparatus and a semiconductor device manufactured by the same apparatus. More particularly, the present invention relates to a plasma processing apparatus which is for use in manufacturing a semiconductor device by plasma discharge of reactive material gas in a sealable chamber, for example, by processing a substrate which is a material to be processed, and in which a plurality of pairs of cathode-anode bodies for performing plasma discharge are provided in the chamber so that a plurality of discharge spaces exist, and also relates to a semiconductor device manufactured by this plasma processing apparatus.

2. Description of the Related Art

A vertical type plasma processing apparatus shown in FIG. 4 is known in the conventional art as a semiconductor device manufacturing apparatus which is a kind of a general plasma processing apparatus.

The semiconductor device manufacturing apparatus shown in FIG. 4 comprises a sealable vertical type chamber 3 as a reactive vessel, and one anode 4 is substantially vertically arranged with respect to a bottom surface of the chamber 3 at its inside center portion. The anode 4 comes in contact with a heater 5. The heater 5 serves to heat a glass substrate 1 (held by a substrate holding part 12), which is a material to be processed, at a constant temperature, for example, 100° C. to 600° C. The semiconductor device manufacturing apparatus further comprises two cathodes 2, 2 which are substantially vertically arranged with respect to the bottom surface of the chamber 3 near the side wall of the inside of the chamber 3.

The semiconductor device manufacturing apparatus will be more specifically described. That is, the anode 4 and the cathodes 2, 2 are arranged so that the anode 4 is sandwiched by the cathodes 2, 2 (in a state where two pairs of the cathode-anode bodies are placed opposite) with a predetermined interval in a horizontal direction. Then, plasma discharge is performed at spaces (two spaces) between the anode 4 and each of the cathodes 2 with reactive material gas introduced from a gas introduction pipe (not shown) into the chamber 3.

The chamber 3 and the anode 4 use material such as stainless steel or aluminum alloy and use ceramics or the like for thermal insulation. Each cathode 2 is arranged so as to face the substrate 1.

In the semiconductor device manufacturing apparatus, in order that plasma discharge in each discharge space is to be the same condition by evenly supplying material gas into a plurality of (two) existing discharge spaces, it is common to provide two, the same number as that of the discharge space, power supplies 8, 8, and two matching boxes 7, 7 for matching impedance between the cathode-anode bodies and the power supplies 8, 8, and to connect each power supply 8 and matching box 7 with a power introduction wire 10.

In addition, as for a conventional plasma processing apparatus, those which improve etching or evaporation uniformity in a plasma chemical technology are known (see, for example, U.S. Pat. No. 4,264,393).

In an apparatus disclosed in U.S. Pat. No. 4,264,393, a power introduction wire which introduces electric power from a power supply is branched into a plurality of cathodes from one power supply in order to evenly distribute electric power from the power supply to the plurality of cathodes.

The aforementioned conventional plasma processing apparatuses have the following problems.

First, the apparatus shown in FIG. 4 will be described. Since this apparatus comprises a separate power supply 8 and a separate matching box 7 for each of the two discharge spaces, the cost is high.

In the case where parallel processing is performed, each processing needs to have the same condition with respect to two discharge spaces. However, since the power supplies 8, 8 have variation, the input power is not necessarily truly the same even when power values are set to be the same. Therefore, since this apparatus is required to perform adjustment according to the respective discharge spaces, control for individual discharge is very complicated, and there is a problem in that variation occurs readily at each discharge.

Next, the apparatus disclosed in U.S. Pat. No. 4,264,393 will be described. In this apparatus, the number of the power introduction wires from the power supply to the cathode is set to be ½ of that of the discharge spaces. It is assumed herein that a homogeneous film is produced between the surfaces of the cathode and the anode by plasma discharge.

However, actually, it is well known that a cathode film obtained by the plasma processing apparatus is inferior in quality compared to an anode film.

In the case where electric power is supplied to each cathode with a power introduction wire branched from one power supply, not only a branching filter is required at every branched point in order to evenly distribute electric power by such a branch method, but also the power introduction wire from the power supply to each cathode differs largely in length.

Consequently, even if a power coaxial cable whose impedance is constant is used, considerable variation can be expected in electric power to be supplied to each cathode. As a result, the apparatus in which parallel processing is assumed to be performed has very large variation in every branch.

SUMMARY OF THE INVENTION

The present invention has been devised in view of such circumstances, and it is an object of the present invention to provide a simply configured plasma processing apparatus which can equally introduce reactive material gas into a plurality of discharge spaces for performing plasma discharge by the reactive material gas inside the chamber, and a semiconductor device manufactured by this plasma processing apparatus.

According to one aspect of an example embodiment, there is provided a plasma processing apparatus comprising: a sealable chamber to be introduced with reactive material gas; a plurality of pairs of cathode-anode bodies arranged in the chamber, for forming a plurality of discharge spaces for performing plasma discharge of the material gas; a power supply for plasma discharge, placed outside the chamber; a matching box placed outside the chamber, for matching impedance between the cathode-anode bodies and the power supply; and a power introduction wire extending to each of the cathodes from the power supply via the matching box, wherein the power introduction wire is branched to the number corresponding to the number of the cathodes between the matching box and the cathodes, and the branched wires are symmetrically extended.

According to another aspect of an example embodiment, there is provided a plasma processing apparatus comprising: a sealable chamber to be introduced with reactive material gas; 2n pairs (n is an integer of one or more) of cathode-anode bodies arranged in the chamber, for forming 2n discharge spaces for performing plasma discharge of the material gas; 2m (m is an integer smaller than n) power supplies for plasma discharge, placed outside the chamber; 2m matching boxes placed outside the chamber, for matching impedance between the cathode-anode bodies and the power supplies; and a power introduction wire extending to each of the cathodes from the power supplies via the matching boxes, wherein the power supplies are synchronized with each other, and the power introduction wire is branched into two wires between the matching box and the cathodes, and the branched wires are symmetrically extended.

According to still another aspect of an example embodiment, there is provided a plasma processing apparatus comprising: a sealable chamber to be introduced with reactive material gas; a plurality of pairs of cathode-anode bodies arranged in the chamber, for forming a plurality of discharge spaces for performing plasma discharge of the material gas; a power supply for plasma discharge, placed outside the chamber; and a power introduction wire extending to each of the cathodes from the power supply, wherein the power introduction wire is branched to the number corresponding to the number of the cathodes between the power supply and the cathodes, and the branched wires are symmetrically extended.

According to yet another aspect of an example embodiment, there is provided a semiconductor device manufactured by the plasma processing apparatus according to any one of the aforementioned aspects.

DESCRIPTION OF THE PREFERRED EMBODIMENTS

Figure 1:
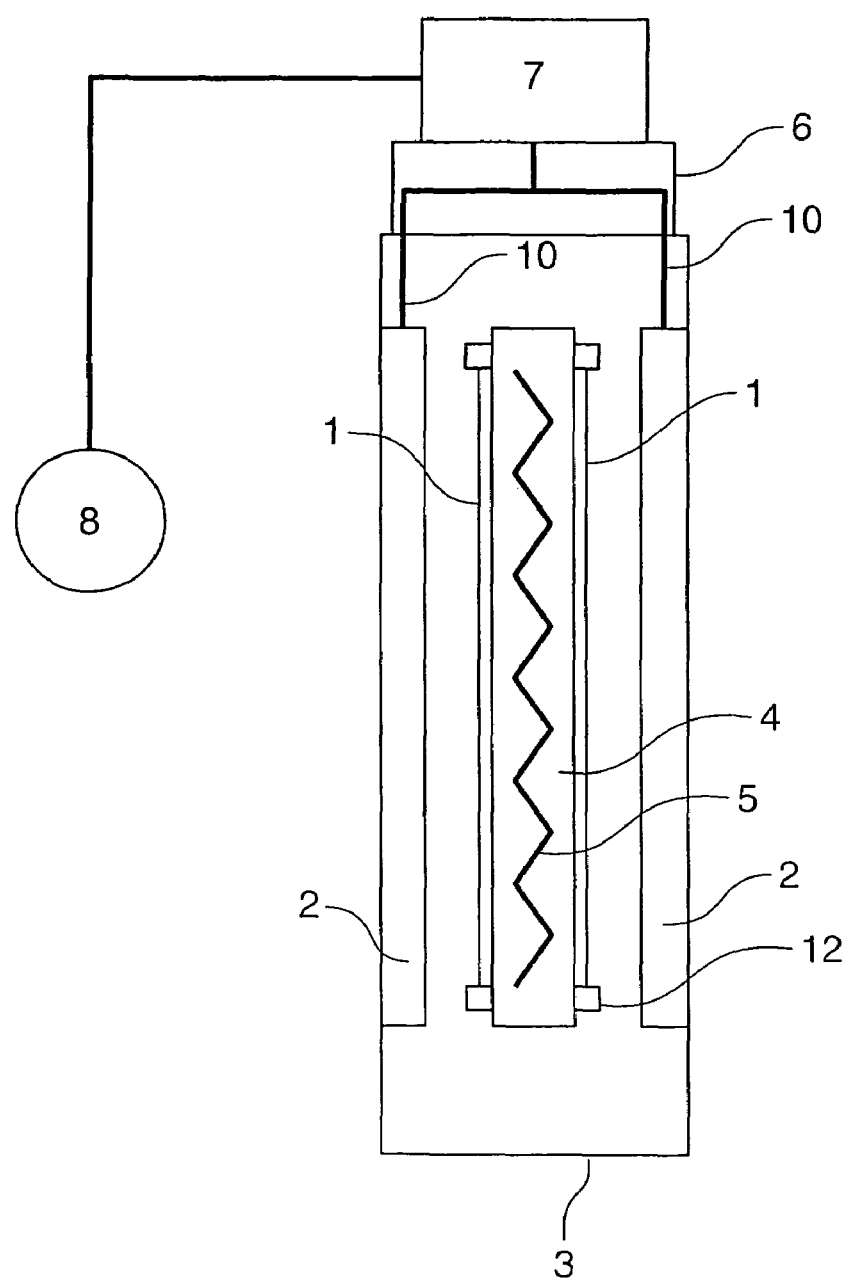
FIG. 1 is a schematic longitudinal sectional view showing a plasma processing apparatus (one power supply and two branches) according to a first example embodiment.

In the plasma processing apparatus according to one aspect of an example embodiment, since a power introduction wire extending from a power supply to each cathode via a matching box is branched according to a number corresponding to a number of the cathodes between the matching box and the cathodes and the branched wires are symmetrically extended, electric power can be evenly supplied to a plurality of discharge spaces in the chamber without providing a special adjustment mechanism.

In the plasma processing apparatus according to another aspect of an example embodiment, since 2m power supplies are synchronized with each other, a power introduction wire extending from the power supplies to each cathode via 2m matching boxes is branched into two wires between the matching box and the cathodes and the branched wires are symmetrically extended, electric power can be evenly supplied to a plurality of discharge spaces in the chamber without providing a special adjustment mechanism.

In the plasma processing apparatus according to still another aspect of an example embodiment, since a power introduction wire extending from a power supply to each cathode is branched to the number corresponding to the number of the cathodes between the power supply and the cathodes and the branched wires are symmetrically extended, electric power can be evenly supplied to a plurality of discharge spaces in the chamber without providing a special adjustment mechanism.

In the semiconductor device according to yet another aspect of an example embodiment, since there is used a plasma processing apparatus in which electric power can be evenly supplied to a plurality of discharge spaces in the chamber without providing a special adjustment mechanism, a low cost semiconductor device can be manufactured with little variation in quality.

In the plasma processing apparatus according to an example embodiment, for example, the plurality of pairs of cathode-anode bodies may be composed of four pairs of cathode-anode bodies, and the power introduction wire may be branched into two wires between the matching box and the cathodes, and then the branched wires may be further branched into two wires. With this configuration, electric power can be evenly supplied to the four discharge spaces in the chamber without providing a special adjustment mechanism.

In the plasma processing apparatus according to an example embodiment, for example, the plurality of pairs of cathode-anode bodies may be composed of 2n pairs (n is an integer of one or more) of cathode-anode bodies, and the power introduction wire may be branched into 2n wires between the matching box and the cathodes. With this configuration, electric power can be evenly supplied to the 2n discharge spaces in the chamber without providing a special adjustment mechanism.

In the plasma processing apparatus according to an example embodiment, for example, the power introduction wire may be accommodated in a housing arranged for every branched part between the matching box and the chamber. With this configuration, probability of occurring of mutual interference between branched power introduction wires can be prevented in the case where one power supply is provided. Further, probability of occurring of mutual interference between the power supplies and between the branched power introduction wires can be prevented in the case where a plurality of power supplies are provided.

In the plasma processing apparatus according to an example embodiment, preferably, the power supply operates at a frequency from 1 MHz or more to 60 MHz or less. With this power supply, electric power can be supplied to a large cathode having a size of several meters, irrespective of the shape of the cathode which inputs electric power.

In the plasma processing apparatus according to an example embodiment, preferably, the power introduction wire is made of copper, aluminum, nickel, silver, gold, or an alloy primarily composed of these metals. This power introduction wire can sufficiently respond to the increase of impedance caused by lengthened wire due to performing a plurality of branches.

Three example embodiments showing a plasma processing apparatus will be described below. It is to be noted that the present invention is not limited to these embodiments.

First Embodiment

FIG. 1 is a schematic longitudinal sectional view showing a semiconductor device manufacturing apparatus as a plasma processing apparatus according to a first example embodiment.

In the semiconductor device manufacturing apparatus, an anode 4 and cathodes 2, 2 are arranged so that the anode 4 is sandwiched by the cathodes 2, 2 with a predetermined interval in a horizontal direction. Then, plasma discharge is performed at spaces (two discharge spaces) between the anode 4 and each of the cathodes 2, 2 with reactive material gas introduced into a chamber 3.

The semiconductor device manufacturing apparatus will be more specifically described. That is, the semiconductor device manufacturing apparatus comprises the chamber 3 which is a sealable vertical type as a reactive vessel, and one anode 4 is substantially vertically arranged with respect to a bottom surface of the chamber 3 at its inside center portion. Glass substrates 1, 1, which are materials to be processed, are arranged on both sides of the anode 4.

The chamber 3 uses stainless steel, aluminum alloy, or the like and uses ceramics or the like for thermal insulation. Further, in the chamber 3, the cathodes 2, 2 are arranged so to face the substrates 1, 1, respectively. The anode 4 is made of material having conductivity and heat resistance, such as stainless steel, aluminum alloy, and carbon.

The substrates 1, 1 generally use a silicon substrate, a glass substrate, or the like; however, it is not limited to these substrates. In the illustrated example embodiment, glass substrates 1, 1 are used. The anode 4 has dimensions suitably determined in accordance with those of the glass substrates 1, 1 for forming a thin film. Here, the anode 4 is designed to be dimensions in 1000 to 1500 mm×600 to 1000 mm with respect to those of the substrates 1, 1, 900 to 1200 mm×400 to 900 mm.

The anode 4 incorporates a heater 5 which performs control for heating the anode 4 to be the room temperature to 300° C. In the illustrated example embodiment, the anode 4 uses a heater which incorporates an encapsulated type heating device such as a sheathed heater and an encapsulated type temperature sensor such as a thermocouple in an aluminum alloy, and the heater performs control for heating the anode to be the room temperature to 300° C.

The cathodes 2, 2 are made of stainless steel, aluminum alloy, or the like. In the illustrated example embodiment, aluminum alloy is used. Dimensions of the cathode 2 are set to suitable values in accordance with those of the substrate 1 which performs film formation. In the illustrated example embodiment, in the cathode 2 is dimensioned as 1000 to 1500 mm×600 to 1000 mm.

Electric power is supplied to the cathodes 2, 2 by one plasma excitation power supply 8. The power supply 8 uses an AC electric power of 10 W to 100 kW at a frequency of 1.00 MHz to 60 MHz.

In the illustrated embodiment, the power supply uses 10 W to 10 kW at 13.56 MHz to 60 MHz.

One matching box 7 is arranged between the power supply 8 and the chamber 3 for matching impedance between the cathode-anode bodies 2, 4 and the power supply 8. The power supply 8 and the matching box 7 are connected with one power introduction wire 10.

The power introduction wire 10 is branched into two wires between the matching box 7 and the cathodes 2 and the branched wires are symmetrically extended (horizontal line symmetry in FIG. 1) in order to evenly supply electric power from the power supply 8 to a plurality of (two) discharge spaces in the semiconductor device manufacturing apparatus.

After branching, the electric power is inputted to each cathode 2 via a plurality of power introduction terminals provided on cathode connection parts. Since respective distances of the power introduction wire 10 from the branched part to the cathode connection parts are configured so as to be the same distance, interconnection impedance becomes the same, so that the electric power is equally divided. Here, the power introduction wire 10 between the matching box 7 and the chamber 3 is accommodated in one housing 6 placed between the matching box 7 and the chamber 3.

In the example semiconductor device manufacturing apparatus as configured above, material gas is filled into a clearance between the cathodes 2, 2 and the anode 4 at a predetermined flow rate and pressure and high frequency power is applied to the cathodes 2, 2 and the anode 4, thereby generating a glow discharge region (plasma discharge region) between the cathodes 2, 2 and the anode 4. Then, an amorphous film or a crystalline film can be formed on the surfaces of the substrates 1, 1.

Furthermore, since the films formed in the respective discharge spaces have the same film formation speed and the same film quality, it can be concluded that equivalent discharge spaces are formed.

In the semiconductor device manufacturing apparatus according to the first embodiment as configured above, there are two discharge spaces in one chamber 3, the power introduction wire 10 for introducing from one power supply 8 to each of the cathodes 2, 2 is branched into two wires between the matching box 7 and the cathodes 2, 2, and the branched wires are further symmetrically extended from the branched part to the cathodes 2, 2.

Consequently, electric power can be evenly supplied to two discharge spaces without providing a special adjustment mechanism, whereby a semiconductor device such as a solar cell using a semiconductor thin film or an optical thin film, a thin film transistor (TFT), or a photosensitive member can be efficiently obtained at low cost.

Since the power introduction wire 10 is accommodated in the housing 6 between the matching box 7 and the chamber, probability of mutual interference occurring between the branched power introduction wires 10 can be prevented.

Second Embodiment

Figure 2:
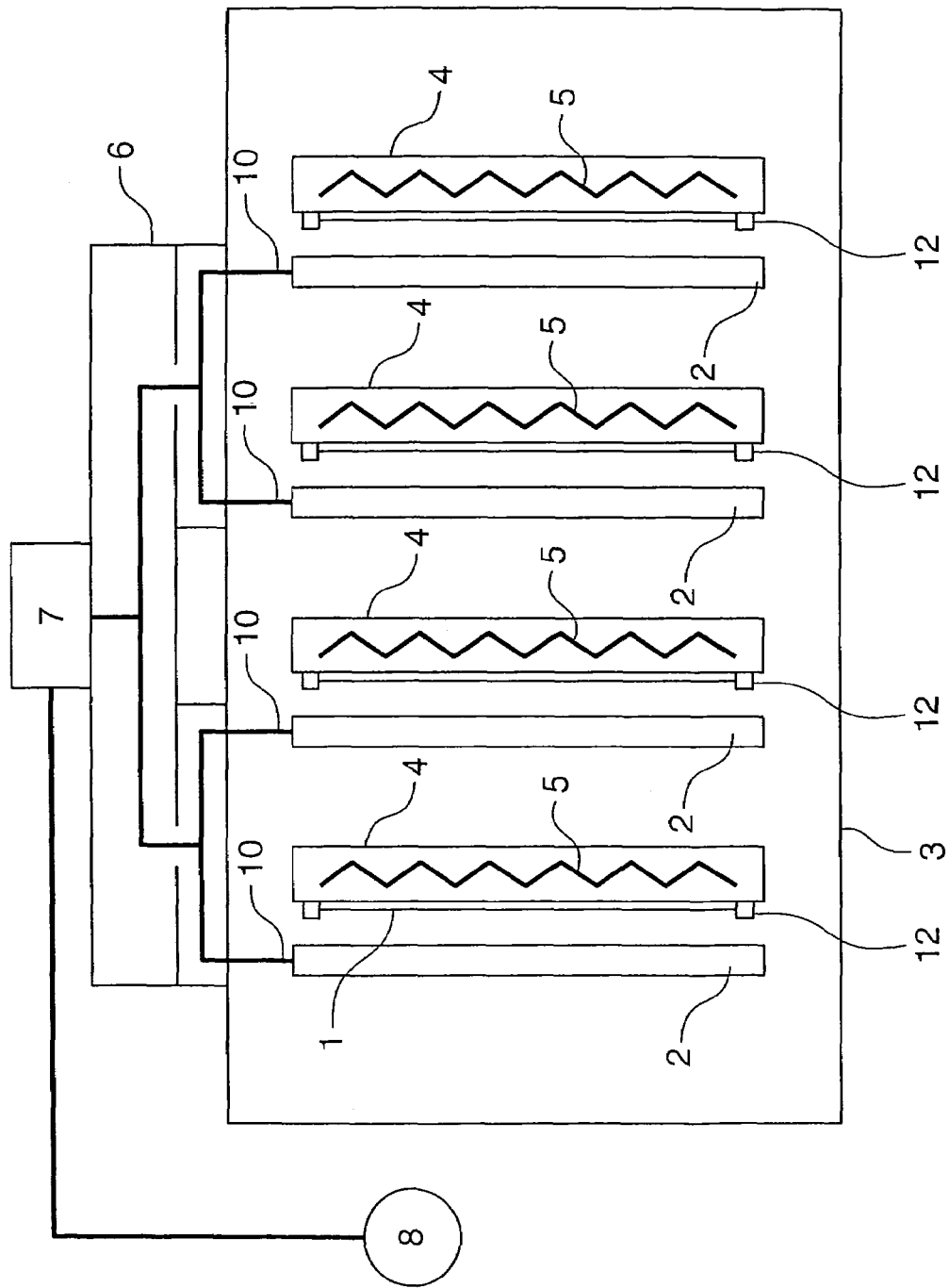
FIG. 2 is a schematic longitudinal sectional view showing a plasma processing apparatus (one power supply and four branches) according to a second example embodiment.

FIG. 2 is a schematic longitudinal sectional view showing a semiconductor device manufacturing apparatus as a plasma processing apparatus according to a second example embodiment.

In a sealable chamber 3, four pairs of cathode-anode bodies 2, 4 are substantially vertically arranged with respect to a bottom surface of the chamber 3. Then, plasma discharge is performed at spaces (four discharge spaces) between the anodes 4 and the cathodes 2 with reactive material gas introduced into the chamber 3. The cathode-anode bodies 2, 4 comprise four pairs for simplification in FIG. 2; however, it is not limited to this. The anode 4 is comprised of material having conductivity and heat resistance, such as stainless steel, aluminum alloy, and carbon.

A glass substrate 1 (which is a material to be processed) is arranged on the left side of each anode 4. The substrate 1 generally uses a silicon substrate, a glass substrate, or the like;

however, it is not limited to these substrates. In the example embodiment, a glass substrate 1 is used.

The anode 4 has dimensions suitably determined in accordance with those of the glass substrates 1 for forming a thin film. In the example embodiment, the anode 4 is designed to have dimensions of 1000 to 1500 mm×600 to 1000 mm with respect to those of the substrate 1 (900 to 1200 mm×400 to 900 mm).

The anode 4 incorporates a heater 5 which performs control for heating the anode 4 to be from room temperature to 300° C. In the example embodiment, the anode 4 uses a heater which incorporates an encapsulated type heating device such as a sheathed heater and an encapsulated type temperature sensor such as a thermocouple in an aluminum alloy, the heater performs control for heating the anode between the room temperature and 300° C.

The cathodes 2 are made of stainless steel, aluminum alloy, or the like. In the example embodiment, aluminum alloy is used. Dimensions of the cathode 2 are set to suitable values in accordance with those of the substrate 1 which performs film formation. In the example embodiment, the cathode is dimensioned at 1000 to 1500 mm×600 to 1000 mm.

Electric power is supplied to the cathodes 2 by one plasma excitation power supply 8. The power supply 8 uses an AC electric power of 10 W to 100 kW at a frequency of 1.00 MHz to 60 MHz. Here, the power supply uses 10 W to 10 kW at 13.56 MHz to 60 MHz.

One matching box 7 is arranged between the power supply 8 and the chamber 3 for matching impedance between the cathode-anode bodies 2, 4 and the power supply 8. The power supply 8 and the matching box 7 are connected with one power introduction wire 10.

In order to evenly supply electric power from the power supply 8 to a plurality of (four) discharge spaces in the semiconductor device manufacturing apparatus, the power introduction wire 10 is branched into two wires between the matching box 7 and the chamber 3, and then, further similarly branched into two wires. The branched wires are symmetrically extended (horizontal line symmetry in FIG. 2).

After branching, the electric power is inputted to each cathode 2 via a plurality of power introduction terminals provided on cathode connection parts. Since respective distances of the power introduction wire 10 from the branched part to the cathode connection parts are configured so as to be the same distance, interconnection impedance becomes the same, so that the electric power is equally divided. Here, the power introduction wire 10 between the matching box 7 and the chamber 3 is accommodated in three small and large housings 6 disposed between the matching box 7 and the chamber 3.

With this configuration, interconnection impedance can be the same by conforming capacitance of the power introduction wire 10.

In the semiconductor device manufacturing apparatus according to the second example embodiment as configured above, material gas is filled into a clearance between the cathode 2 and the anode 4 at a predetermined flow rate and pressure and high frequency power is applied to the cathode 2 and the anode 4, thereby generating a glow discharge region (plasma discharge region) between the cathode 2 and the anode 4. Then, an amorphous film or a crystalline film can be formed on the surface of the substrate 1.

Furthermore, according to the semiconductor device manufacturing apparatus, there are four discharge spaces in one chamber 3, the power introduction wire 10 for introducing from one power supply 8 to each cathode 2 is branched into two wires between the matching box 7 and the cathodes 2, and then, the respective branched wires are further branched into two wires and symmetrically extended from the branched part to the cathodes 2.

Consequently, electric power can be evenly supplied to four discharge spaces without providing a special adjustment mechanism, whereby a semiconductor device such as a solar cell using a semiconductor thin film or an optical thin film, a TFT, or a photosensitive member can be efficiently obtained at low cost.

Further, since the power introduction wires 10 are accommodated in three housing 6 between the matching box 7 and the chamber 3, the probability of mutual interference occurring between the branched power introduction wires 10 can be prevented.

Third Embodiment

Figure 3:
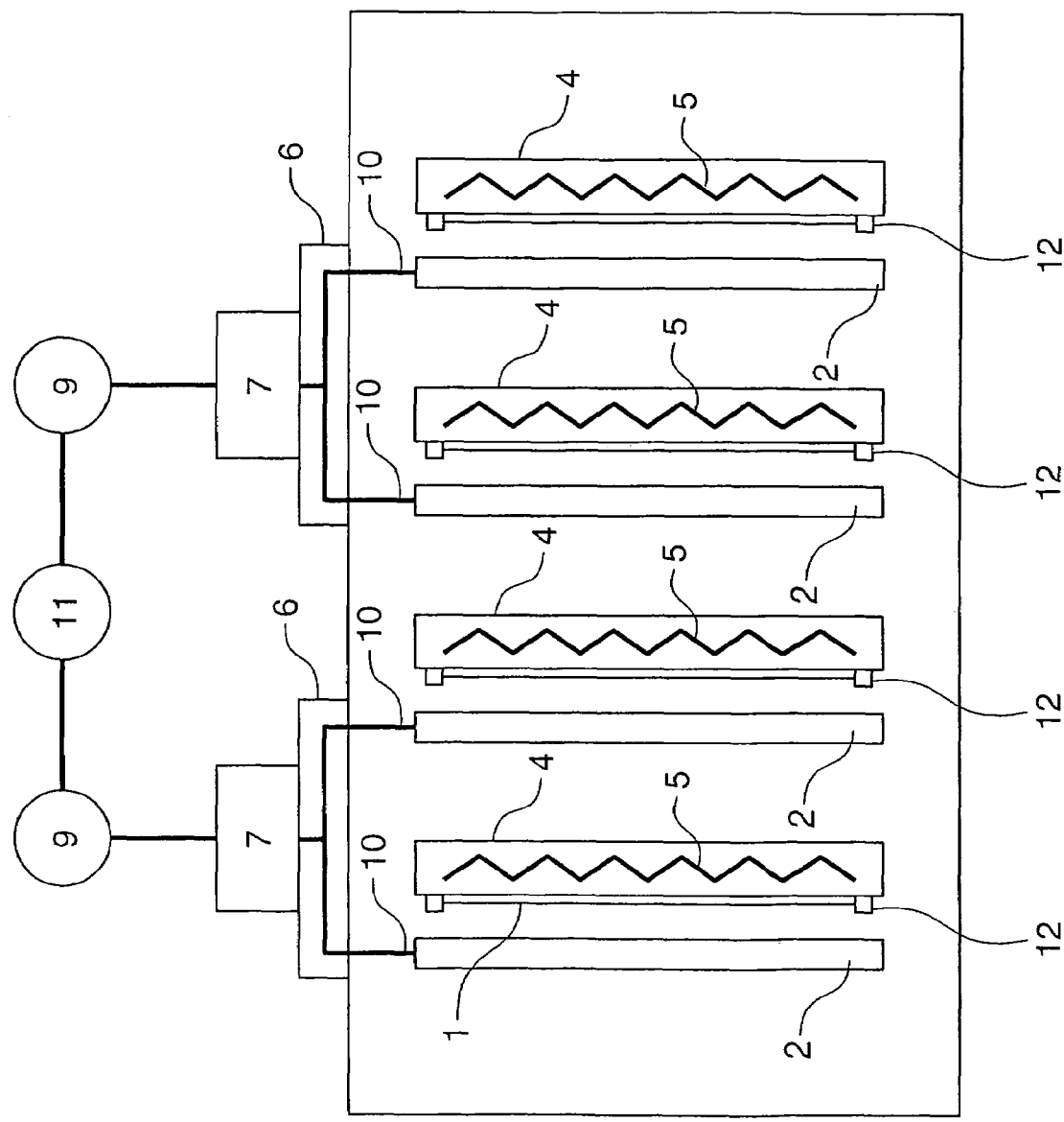
FIG. 3 is a schematic longitudinal sectional view showing a plasma processing apparatus (two power supplies and two branches) according to a third example embodiment.
Figure 4:
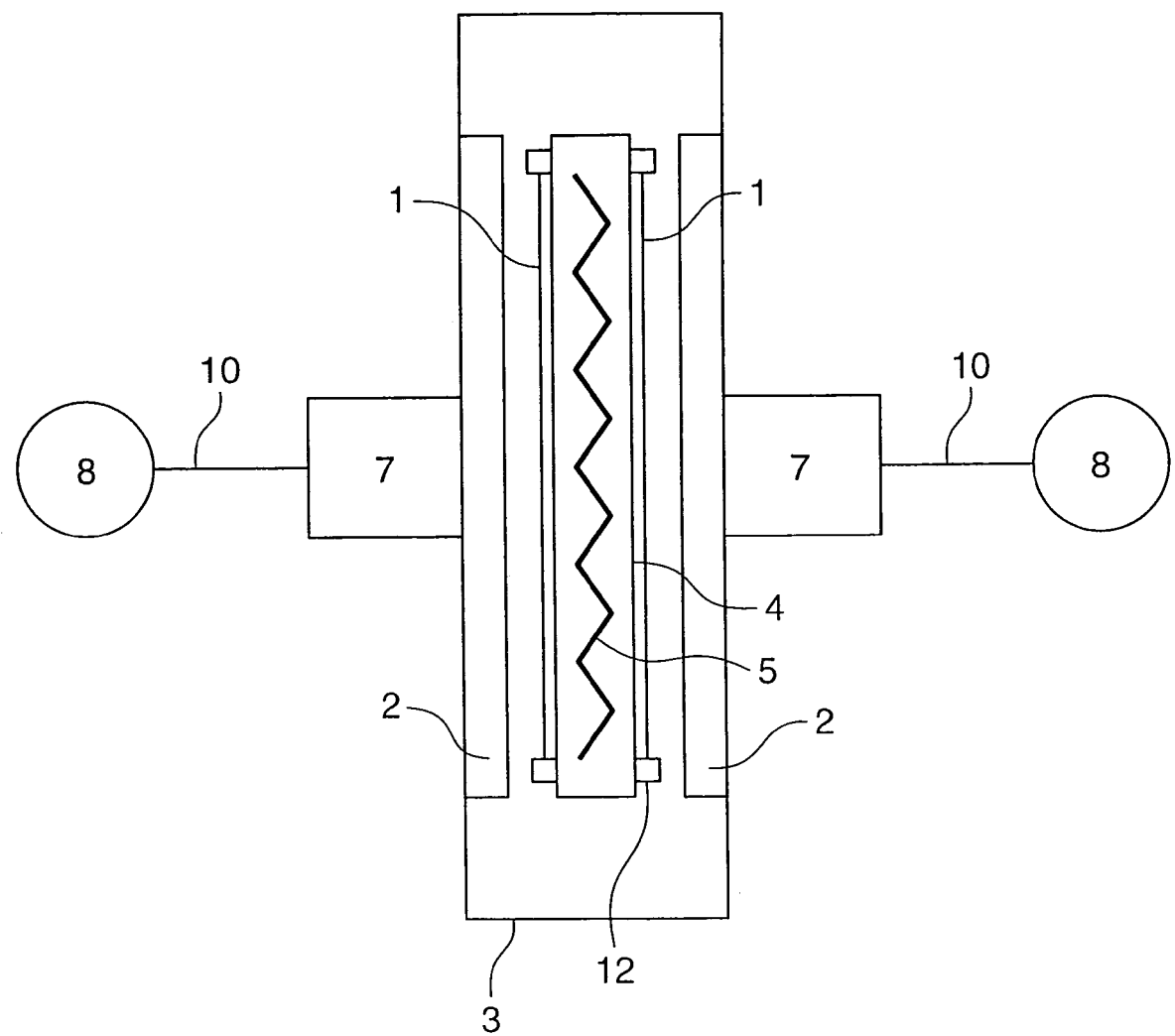
FIG. 4 is a schematic longitudinal sectional view showing a conventional general semiconductor device manufacturing apparatus.

FIG. 3 is a schematic longitudinal sectional view showing a semiconductor device manufacturing apparatus as a plasma processing apparatus according to a third example embodiment.

In a sealable chamber 3, four pairs of cathode-anode bodies 2, 4 are substantially vertically arranged with respect to a bottom surface of the chamber 3. Then, plasma discharge is performed at spaces (four discharge spaces) between the anodes 4 and the cathodes 2 with reactive material gas introduced into the chamber 3. The cathode-anode bodies 2, 4 comprise four pairs for simplification in FIG. 3; however, it is not limited to this. The anode 4 is made of material having conductivity and heat resistance, such as stainless steel, aluminum alloy, and carbon.

A glass substrate 1 which is a material to be processed is arranged on the left side of each anode 4. The substrate 1 generally uses a silicon substrate, a glass substrate, or the like; however, it is not limited to these substrates. In the example embodiment, a glass substrate 1 is used.

The anode 4 has dimensions suitably determined in accordance with those of the glass substrates 1 for forming a thin film. In the example embodiment, the anode 4 is designed to be dimensions in 1000 to 1500 mm×600 to 1000 mm with respect to those of the substrates 1 (900 to 1200 mm×400 to 900 mm).

The anode 4 incorporates a heater 5 which performs control for heating the anode 4 to be the room temperature to 300° C. In the example embodiment, the anode 4 uses a heater which incorporates an encapsulated type heating device such as a sheathed heater and an encapsulated type temperature sensor such as a thermocouple in an aluminum alloy, the heater performs control for heating the anode between the room temperature and 300° C.

The cathodes 2 are made of stainless steel, aluminum alloy, or the like. In the example embodiment, aluminum alloy is used. Dimensions of the cathode 2 are set to suitable values in accordance with those of the substrate 1 which performs film formation. In the example embodiment, it is designed in 1000 to 1500 mm×600 to 1000 mm.

Electric power is supplied to the cathodes 2 by two plasma excitation power supplies 9. Each power supply 9 uses an AC electric power of 10 W to 100 kW at a frequency of 1.00 MHz to 60 MHz. In the example embodiment, the power supply uses 10 W to 10 kW at 13.56 MHz to 60 MHz.

Two ($2^n$ (n is an integer of one or more) and when n=1) matching boxes 7 are arranged between the power supplies 9, 9 and the chamber 3 for matching impedance between the cathode-anode bodies 2, 4 and the power supplies 9, 9. Each power supply 9 and the matching box 7 are connected with one power introduction wire 10.

In order to evenly supply electric power from the power supplies 9, 9 to a plurality of (four) discharge spaces in the semiconductor device manufacturing apparatus, each power introduction wire 10 is branched into two wires between the matching box 7 and the cathode 2. The branched wires are symmetrically extended (horizontal line symmetry in FIG. 3).

Two power supplies 9, 9 share a high frequency generator 11 which is provided between the power supplies 9, 9 and synchronize the amplitudes of the respective power supplies 9, 9. Here, the power introduction wire 10 between each matching box 7 and the chamber 3 is accommodated in one housing 6 which is arranged between each matching box 7 and the chamber 3 in order to conform interconnection impedance of each electric power wire. With this configuration, the interconnection impedance can be the same by conforming interconnection capacitance and electric power can be supplied without interference occurring between the power supplies 9, 9.

After branching, the electric power is inputted to each cathode 2 via a plurality of power introduction terminals. Since respective distances from the branched part to the cathode connection parts are the same, the interconnection impedance becomes the same. Consequently, the electric power is equally divided.

In the semiconductor device manufacturing apparatus as configured above, reactive gas is filled into a clearance between the cathode 2 and the anode 4 at a predetermined flow rate and pressure and high frequency power is applied to the cathode 2 and the anode 4, thereby generating a glow discharge region (plasma discharge region) between the cathode 2 and the anode 4. Then, an amorphous film or a crystalline film can be formed on the surface of the substrate 1. Furthermore, since the film formed in each discharge space is the same film formation speed and the same film quality, it can be concluded that equivalent discharge spaces can be formed.

According to the semiconductor device manufacturing apparatus according to the third example embodiment as configured above, there are four discharge spaces in one chamber 3, and the power introduction wire 10 for introducing from two power supplies 9, 9 to respective cathodes 2 is branched into two wires between the respective matching boxes 7 and the cathodes 2 and is symmetrically extended from the branched part to the cathodes 2.

Consequently, electric power can be evenly supplied to four discharge spaces without providing a special adjustment mechanism, whereby a semiconductor device such as a solar cell using a semiconductor thin film or an optical thin film, a TFT, or a photosensitive member can be efficiently obtained at low cost.

Further, since the power introduction wires 10 are accommodated in the housing 6 between each matching box 7 and the chamber 3, probability of occurring of mutual interference between the power supplies 9, 9 and between the branched power introduction wires 10 can be prevented.

What is claimed is:

1. A plasma processing apparatus comprising:
    a sealable chamber to be introduced with reactive material gas;
    four pairs of cathode-anode bodies arranged in the chamber and configured to form four discharge spaces for performing plasma discharge of the material gas;
    two power supplies for plasma discharge, placed outside the chamber;
    two matching boxes placed outside the chamber and configured to match impedance between the cathode-anode bodies and the power supplies; and
    a power introduction wire extending to each of the cathodes from the power supplies via the matching boxes, wherein
    the power supplies are synchronized with each other, and the power introduction wire is branched into two wires between the matching box and the cathodes, and the branched wires are symmetrically extended.

2. The plasma processing apparatus according to claim 1, wherein the power introduction wire is accommodated in a housing arranged for every branched part between the matching box and the chamber.

3. The plasma processing apparatus according to claim 1, wherein the power supply operates at a frequency from 1 MHz or more to 60 MHz or less.

4. The plasma processing apparatus according to claim 1, wherein the power introduction wire comprises at least one of copper, aluminum, nickel, silver, gold, or an alloy primarily composed of these metals.

5. A semiconductor device manufactured by the plasma processing apparatus according to claim 1.

6. A plasma processing apparatus comprising:
    a sealable chamber to be introduced with reactive material gas;
    a plurality of pairs of cathode-anode bodies arranged in the chamber and configured to form a plurality of discharge spaces for performing plasma discharge of the material gas;
    two power supplies for plasma discharge, placed outside the chamber;
    two matching boxes placed outside the chamber and configured to match impedance between the cathode-anode bodies and the power supplies; and
    a power introduction wire extending to each of the cathodes from the power supplies via the matching boxes, wherein
    the power supplies are synchronized with each other, and the power introduction wire is branched into two wires between the matching box and the cathodes, then each of the branched wires is further branched into two wires, and these branched wires are symmetrically extended.

7. The plasma processing apparatus according to claim 6, wherein the power introduction wire is accommodated in a housing arranged for every branched part between the matching box and the chamber.

8. The plasma processing apparatus according to claim 6, wherein the power supply operates at a frequency from 1 MHz or more to 60 MHz or less.

9. The plasma processing apparatus according to claim 6, wherein the power introduction wire comprises at least one of copper, aluminum, nickel, silver, gold, or an alloy primarily composed of these metals.

10. A semiconductor device manufactured by the plasma processing apparatus according to claim 6.

11. A plasma processing apparatus comprising:
    a sealable chamber to be introduced with reactive material gas;
    a plurality of pairs of cathode-anode bodies arranged in the chamber and configured to form a plurality of discharge spaces for performing plasma discharge of the material gas;
    a plurality of power supplies for plasma discharge, placed outside the chamber;
    a plurality of matching boxes placed outside the chamber and configured to match impedance between the cathode-anode bodies and the power supplies; and a power introduction wire extending to each of the cathodes from the power supplies via the matching boxes, wherein the power supplies are synchronized with each other, and the power introduction wire is branched into $2^n$ (n is an integer of one or more) wires between the matching box and the cathodes, and the branched wires are symmetrically extended.

12. The plasma processing apparatus according to claim 11, wherein the power introduction wire is accommodated in a housing arranged for every branched part between the matching box and the chamber.

13. The plasma processing apparatus according to claim 11, wherein the power supply operates at a frequency from 1 MHz or more to 60 MHz or less.

14. The plasma processing apparatus according to claim 11, wherein the power introduction wire comprises at least one of copper, aluminum, nickel, silver, gold, or an alloy primarily composed of these metals.

15. A semiconductor device manufactured by the plasma processing apparatus according to claim 11.

16. A plasma processing apparatus comprising:

a sealable chamber to be introduced with reactive material gas;

four pairs of cathode-anode bodies arranged in the chamber and configured to form four discharge spaces for performing plasma discharge of the material gas;

two power supplies for plasma discharge, placed outside the chamber;

a high frequency generator provided between the two power supplies;

two matching boxes placed outside the chamber and configured to match impedance between the cathode-anode bodies and the power supplies; and a power introduction wire extending to each of the cathodes from each power supply via each matching box, wherein the power supplies are synchronized with each other, and the power introduction wire between each matching box and the chamber is accommodated in one housing which is arranged between each matching box and the chamber and is branched into two wires in the housing, and the branched wires are symmetrically extended.

17. The plasma processing apparatus according to claim 16, wherein the power supply operates at a frequency from 1 MHz or more to 60 MHz or less.

18. The plasma processing apparatus according to claim 16, wherein the power supply operates at a frequency from 1 MHz or more to 60 MHz or less.

19. The plasma processing apparatus according to claim 16, wherein the power supply operates at a frequency from 1 MHz or more to 60 MHz or less.

* * * * *